(12) United States Patent
Clavelier et al.

(10) Patent No.: US 7,678,635 B2
(45) Date of Patent: Mar. 16, 2010

(54) METHOD OF PRODUCING A TRANSISTOR

(75) Inventors: Laurent Clavelier, Grenoble (FR); Frederic Mayer, Grenoble (FR); Maud Vinet, Rives (FR); Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 204 days.

(21) Appl. No.: 12/030,672

(22) Filed: Feb. 13, 2008

(65) Prior Publication Data

US 2008/0200001 A1 Aug. 21, 2008

(30) Foreign Application Priority Data

Feb. 15, 2007 (FR) .................................. 07 53288

(51) Int. Cl.
H01L 21/336 (2006.01)
H01L 21/8234 (2006.01)
(52) U.S. Cl. ................ 438/197; 438/301; 257/E21.632
(58) Field of Classification Search ................ 438/197, 438/199, 301, 303, 947; 257/E21.632
See application file for complete search history.

(56) References Cited

U.S. PATENT DOCUMENTS 5,918,128 A 6/1999 Gardner et al.
6,828,259 B2 12/2004 Fisher et al.
6,867,116 B1 3/2005 Chung
6,869,899 B2 3/2005 Mahorowala et al.
2005/0272259 A1 12/2005 Hong
2008/0050881 A1* 2/2008 Chen et al. .................. 438/301

FOREIGN PATENT DOCUMENTS

WO WO 02/37183 A2 5/2002
WO WO 2004/003997 A2 1/2004

OTHER PUBLICATIONS

C. Charbuillet, et al., "High Current Drive in Ultra-Short Impact Ionization MOS (I-MOS) Devices", IEDM, Dec. 11, 2006, 3 pages.
Woo Young Choi, et al., "70-nm Impact-Ionization Metal-Oxide-Semiconductor (I-MOS) Devices Integrated with Tunneling Field-Effect Transistors (TFETs)", IEDM, 2005, 4 pages.

(Continued)

*Primary Examiner*—Hoai V Pham
(74) *Attorney, Agent, or Firm*—Oblon, Spivak, McClelland, Maier & Neustadt, L.L.P.

(57) ABSTRACT

Method of producing a transistor, comprising in particular the steps of: producing a first etching mask on a gate layer, one edge of the first mask forming a pattern of the first edge of a gate of the transistor, etching the gate layer according to the first etching mask, first ion implantation in a part of the substrate not covered by the gate layer, trimming the first etching mask over a length equal to a gate length of the transistor, producing a second etching mask on the gate layer, removing the first etching mask etching the gate layer according to the second etching mask, second ion implantation in another part of the substrate.

14 Claims, 5 Drawing Sheets

OTHER PUBLICATIONS

Jone F. Chen, et al., "0.35-μm Asymmetric and Symmetric LDD Device Comparison Using a Reliability/Speed/Power Methodology", IEEE Electron Device Letters, vol. 19, No. 7, Jul. 1998, pp. 216-218.

F. Mayer, et al., "Co-integration of 2 m V/dec Subthreshold Slope Impact Ionization MOS (I-MOS) with CMOS", Solid-State Device Research Conference, Sep. 2006, Proceeding of the 36th European, 4 pages.

* cited by examiner

METHOD OF PRODUCING A TRANSISTOR

TECHNICAL FIELD AND PRIOR ART

This document concerns a method of producing transistors, for example of the TFET type ("Tunnel Field Effect Transistor"), symmetrical or asymmetric CMOS type ("Complementary Metal-Oxide Semiconductor"), or IMOS type ("Impact Ionisation Metal-Oxide Semiconductor Field-Effect Transistor").

In order to increase the performance and integration density of transistors in the microelectronics industry, the characteristic dimensions of these transistors must be reduced with each new generation of transistor. Two major problems are posed by this reduction in dimensions:
  the increase in leakage currents in the transistors, consequently increasing their electrical consumption,
  the increase in the technological constraints, in particular for mastering the nanometric dimensions of the transistor components to be produced.

In this context, the semiconductor industry has to explore methods parallel to the CMOS: the TFET and IMOS are two potential candidates for overcoming these problems. Compared with a MOS type transistor having source and drain regions of the same doping type and conventionally symmetrical (P+ doped for a PMOS and N+ for an NMOS), a TFET transistor has asymmetry of doping between its source (P+) and its drain (N+). An IMOS transistor has double asymmetry: first of all asymmetry of doping between its source (P+) and its drain (N+), but also structural asymmetry with regard to the intrinsic channel region, situated between the source and the drain, which is not entirely covered by the gate, on the same side as the source of the transistor.

Devices of the TFET or IMOS type make it possible to obtain a better compromise between the OFF current, the ON current and the threshold voltage, and therefore to reduce the energy consumption of these devices compared with a CMOS type device. However, compared with CMOS technology, these two types of device are more difficult to produce, in particular because of the asymmetry of doping between the source and the drain.

To achieve asymmetry of doping between the source and drain in planar technology, there exist today two techniques:
  aligning the N and P implantation levels with respect to the middle of the gate. This method requires controlling an alignment to more or less $L_G/2$, with $L_G$ the length of the gate, which means that it is difficult to make it compatible with the nanometric dimensions of the elements that it is sought to obtain since, even with the latest generations of lithographic tools, the theoretical limit of the level to level misalignment obtained, that is to say the precision of the lithography machine, is approximately ±40 nm. Such a technique, used for producing a transistor of the IMOS type, is for example described in the document "*High Current Drive in Ultra-Short Impact Ionization MOS (I-MOS) Devices*" by C. Charbuillet et al, IEDM, San Francisco, Dec. 11, 2006;
  using an already doped layer for producing either the source or the drain, which is protected by a layer of oxide. There is then only a single implantation to be implemented. Such a technique is for example described in the document "*70-nm Impact-Ionization Metal-Oxide-Semiconductor (IMOS) Devices Integrated with Tunneling Field-Effect Transistors (TFETs)*" by W. Y. Choi et al, IEDM 2005, pages 975 to 978. With this technique, the problem of alignment with respect to the middle of the gate is resolved. However, this method is not compatible with a CMOS technology since, in order to obtain for example an N-IMOS, it is necessary to use at the start of the process an N+ layer that will form the drain and a protection oxide for the P+implantation, and in order to obtain a P– IMOS it is necessary to use a P+ layer in place of the N+ layer. In addition, the architecture obtained is no longer entirely planar (the source and drain contacts are not at the same level).

In order to obtain nanometric lengths of gates, there currently exist three solutions: either using an e-beam (electron beam) photolithography method possibly followed by a trimming or paring step, or using a phase shift reticule possibly followed by a trimming step, or finally using a DUV (deep ultraviolet) photolithography step comprising a trimming step (with the use or not of a hard mask). In the latter solution, using a hard mask, this mask is first of all deposited on a gate stack (gate layer and gate dielectric) from which the gate will be produced. A first DUV lithography followed by an etching step then makes it possible to produce the hard mask according to certain dimensions. Next a trimming is carried out consisting of reducing the dimensions of the hard mask, by a chemical attack, in order to bring the length of the mask equal to the length of the gate required, this length in general being less than the resolution that can be obtained by lithographic tools. Next the gate stack is etched according to the pattern defined by the hard mask in order to obtain the gate. The document U.S. Pat. No. 6,828,259 describes such a method.

Moreover, e-beam lithography has the drawback of being very lengthy, and the use of a phase shift reticule is very expensive in particular because of the manufacture of the reticule.

DISCLOSURE OF THE INVENTION

There therefore exists a need to propose a method of producing a transistor making it possible firstly to obtain transistors having gates with nanometric dimensions using optical lithography that is inexpensive since it uses neither electron beam nor phase shift reticule and secondly possible introducing a doping asymmetry between the source and the drain of the transistor while being compatible with CMOS technology.

For this purpose, a method of producing a gate is proposed, comprising at least the steps of:
  producing a first etching mask on a gate layer based on at least one gate material, one edge of the first etching mask forming a pattern of a first edge of the gate to be produced,
  etching at least a first part of the gate layer not covered by the first etching mask, forming the first edge of the gate,
  trimming said edge of the first etching mask over a length substantially equal to the length of the gate to be produced, revealing a second part of the gate layer,
  producing a second etching mask at least on the second part of the gate layer,
  removing the first etching mask,
  etching at least a third part of the gate layer not covered by the second etching mask, forming a second edge of the gate, the remaining part of the gate layer forming the gate.

Thus it is possible to produce gates with nanometric dimensions without being limited by the resolution of the lithographic tools. In addition, this method does not prevent the achievement of a doping or structural asymmetry, for example for producing a transistor of the TFET or IMOS type, while being usable for producing transistors of the CMOS type. This method does not have recourse to electron beam lithography, which represents a very significant saving in time compared with the methods requiring electron beam lithography. Finally, the cost of producing the mask used is reduced compared with the methods of the prior art using a phase shift reticule.

The production of the second etching mask can be achieved by a step of deposition of a layer of second mask at least on the second part of the gate layer and on the first etching mask and a step of mechanical/chemical polishing of the layer of second mask, baring the first etching mask and forming the second etching mask.

This method does not involve the use of heat treatments at high temperatures, for example above approximately 600° C. This method is therefore compatible with certain materials not withstanding such high temperatures, such as germanium. In this method, the highest temperatures are achieved during deposition steps involving temperatures less that approximately 600° C., these temperatures being able for example to reach at maximum 450° C.

A method of producing a MOS type transistor is also proposed, comprising at least the steps of:

producing a stack comprising at least one substrate based on at least one semiconductor, on which are disposed a dielectric layer, a gate layer and a layer of first mask, implementing a method of producing a gate as described above, removing the second etching mask, ion implantation in a part of the substrate not covered by the gate, forming the source and drain regions of the transistor.

In this case, the ion implantation can be implemented by a first step of producing lightly doped regions by ion implantation in the part of the substrate not covered by the gate, on each side of the gate, intended to be alongside the channel region of the transistor, and a second step of doping of the part of the substrate not covered by the gate, forming the source and drain regions of the transistor.

Lightly doped means here and in the rest of the document a doping less than the doping of the source and drain regions carried out during the second doping step. The lightly doped regions are also referred to as LDD or LDS regions ("Lightly Doped Drain or Source").

In addition the method may comprise, between the first step of producing the lightly doped regions and the second doping step, a step of producing one or more spacers at the edge of the gate, the second doping step being carried out in the part of the substrate not covered by the gate and by said spacer or spacers.

Thus it is possible to produce a transistor of the asymmetric MOS type. The advantages of such a transistor are for example described in the document "0.35-μm Asymmetric and Symmetric LDD Device Comparison Using a Reliability/Speed/Power Methodology" by J. F. Chen et al, IEEE Electron Device Letters, vol. 19, no. 7, July 1998.

A particular embodiment proposes a method of producing a transistor comprising at least the steps of, for example in this order:

a) producing a stack comprising at least one substrate based on at least one semiconductor, on which there are disposed a dielectric layer, a gate layer and a layer of first mask, b) producing a first etching mask from the layer of first mask, an edge of the first etching mask forming a pattern of a first edge of a gate of the transistor to be produced, c) etching at least a first part of the gate layer not covered by the first etching mask, forming the edge of the gate, d) first ion implantation in a first part of the substrate not covered by the gate layer, e) trimming said edge of the first etching mask over a length substantially equal to a gate length of the transistor, revealing a second part of the gate layer, f) producing a second etching mask at least on the second part of the gate layer and over a part of the dielectric layer not covered by the gate layer, g) removing the first etching mask, h) etching a third part of the gate layer not covered by the second etching mask, forming a second edge of the gate, the remaining part of the gate layer forming the gate, i) second ion implantation in a second part of the substrate not covered by the gate and/or by the second etching mask, j) removing the second etching mask.

This method makes it possible to produce a transistor for example of the MOS, TFET or IMOS type, the gate of which is of nanometric dimensions without being limited by the resolution of the lithographic tools. This method has the same advantages as those described previously concerning the gate production method and the method of producing the MOS-type transistor. In addition, this method makes it possible to have recourse to a limited number of etching masks.

The production of the second etching mask can be achieved by a step of deposition of a second mask layer at least on the second part of the gate layer, on the part of the dielectric layer not covered by the gate layer and on the first etching mask, and a step of mechanical/chemical polishing of the layer of second mask, baring the first etching mask and forming the second etching mask.

Here too, the method does not involve the implementation of heat treatments at high temperatures and therefore allows the use of certain materials not withstanding such high temperatures.

The first and/or the second etching mask may be based on $SiO_2$, and/or SiN, and/or amorphous carbon.

Thus, unlike the etching masks based on polymers, by using such materials for producing the etching masks, the trimming of step e) can be carried out over a chosen length, corresponding to that of the gate, independently of the anisotropy of the materials of the masks used. The shape factor of the gate that it is intended to produce is therefore not limited by the anisotropy of the material of the etching mask used.

The first and second ion implantations can form source and drain regions doped with the same type of conductivity. Thus the transistor produced is of the MOS type.

In a variant, one of the first or second ion implantations can form a doped region of the N+ type and the other one of the first or second ion implantations can form a doped region of the P+ type. Thus the transistor produced is of the TFET or IMOS type. This possibility of producing asymmetrically doped regions can in particular be obtained by producing the second etching mask between the two implantation steps.

The first and/or second ion implantation can be implemented by a first step of producing at least one lightly doped region LDD ("Lightly Doped Drain") or LDS ("Lightly Doped Source"), by ion implantation, respectively in said first and/or second part of the substrate, intended to be alongside the channel region of the transistor, and in a second doping step, forming for example at least one region of the HDD ("Heavy Doped Drain") or HDS ("Heavy Doped Source") type, of a said first and/or second part of the substrate, forming the source and/or drain region of the transistor.

In this case, the method can also comprise, between the first step of producing a lightly doped region and the second doping step, a step of producing at least one spacer at the edge of the gate, the second doping step being performed in the part of the substrate not masked and/or not covered by the spacer.

In addition, the method can also comprise, between step h) and step i), a step of producing at least one spacer on the dielectric layer, alongside the second edge of the gate, the second ion implantation of step i) then being able to be performed in the second part of the substrate also not covered by said spacer. Thus the transistor produced is of the IMOS type.

Step e) of trimming the edge of the first etching mask can be carried out by an isotropic chemical attack.

The method can comprise, after step j) of removing the second etching mask, a step of removing parts of the dielectric layer not covered by the gate.

The method can comprise, after the step of removing the parts of the dielectric layer not covered by the gate, a step of producing gate spacers around the gate.

Finally, the method can also comprise, after the step of removing parts of the dielectric layer not covered by the gate, a step of producing a layer of silicide on the doped parts of the substrate.

BRIEF DESCRIPTION OF THE DRAWINGS

The present invention will be better understood from a reading of the description of example embodiments given purely by way of indication and in no way limitative, referring to the accompanying drawings, in which.

Identical, similar or equivalent parts in the various figures described below bear the same numerical references so as to facilitate reading from one figure to another.

The various parts shown in the figures are not necessarily shown to a uniform scale, in order to make the figures more legible.

The various possibilities (variants and embodiments) must be understood as not being exclusive of one another and can be combined with one another.

DETAILED DISCLOSURE OF PARTICULAR EMBODIMENTS

Reference is made first of all to FIGS. 1 to 9, which show the steps of a method of producing a TFET 100 having asymmetry between a source P+ and a drain N+.

Figure 1:
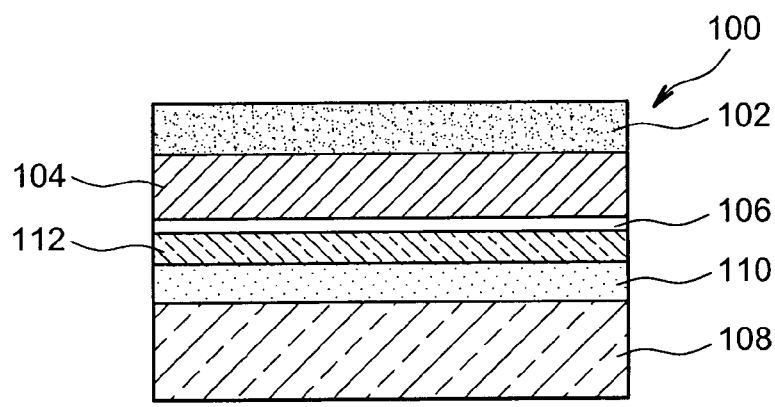
FIGS. 1 to 9 show steps of a method of producing a transistor of the TFET type according to a particular embodiment.

In FIG. 1, there is first produced a stack of a layer of a first mask 102, for example based on $SiO_2$, and/or SiN, and/or amorphous carbon, on a gate layer 104, for example based on a metal material and/or polysilicon and/or TiN and/or any other compatible material for forming a gate material that can be etched, itself disposed on a dielectric layer 106, for example based on $SiO_2$, and/or SiON obtained for example by nitriding $SiO_2$ and/or any other dielectric with high permittivity ($HfO_2$ and/or $ZrO_2$ and/or $Al_2O_3$ etc.) intended to form a gate dielectric. The dielectric layer 106 is disposed on an SOI substrate ("Silicon On Insulator") formed by a first layer 108 based on at least one semiconductor, for example silicon and/or germanium and/or an alloy based on SiGe, a buried oxide layer 110, for example based on $SiO_2$, and a second layer 112 based on at least one semiconductor, for example silicon. This stack may for example be produced by CVD (chemical vapour deposition) and/or PECVD (plasma enhanced chemical vapour deposition) and/or LPCVD (low pressure chemical vapour deposition) and/or ALCVD (atomic layer chemical vapour deposition) and/or MOCVD (metal-organic chemical vapour deposition) and/or SACVD (sub-atmospheric chemical vapour deposition) and/or by rotation deposition (spin-on).

Figure 2:
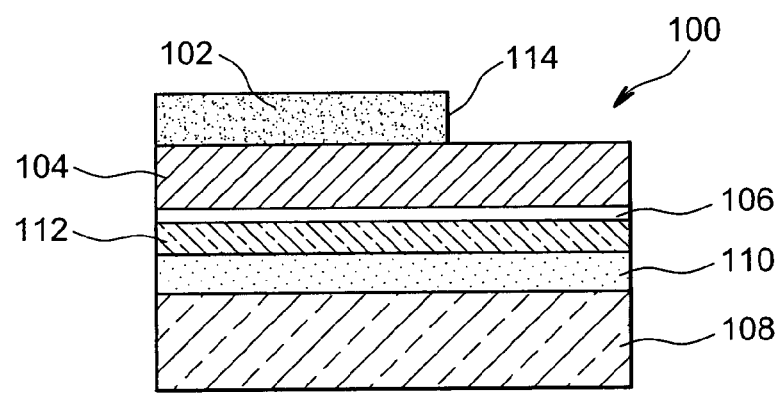

In FIG. 2, optical lithography is carried out, for example of the DUV type, and etching of the layer of a first mask 102 in order to form a first hard mask, a straight edge 114 of which is intended to define a first side of the future gate of the transistor 100. In the remainder of the description, the reference 102 is used to designate the first hard mask.

Figure 3:
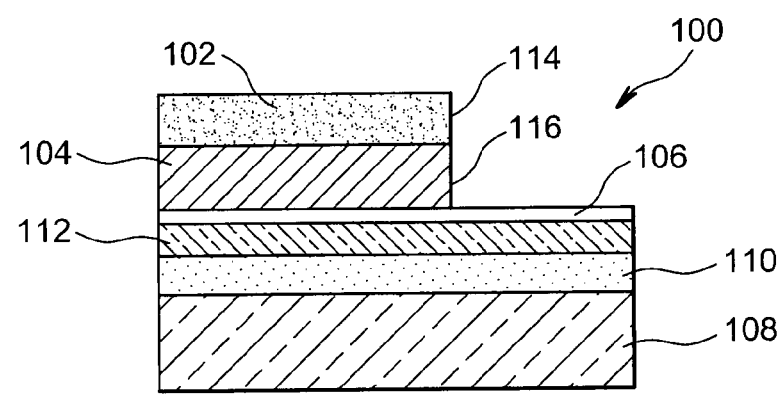

Next part of the gate layer 104 that is not covered by the first hard mask 102 is etched anisotropically, stopping on the dielectric layer 106, thus defining a straight edge 116 of the future gate of the transistor 100 (FIG. 3).

Figure 4:
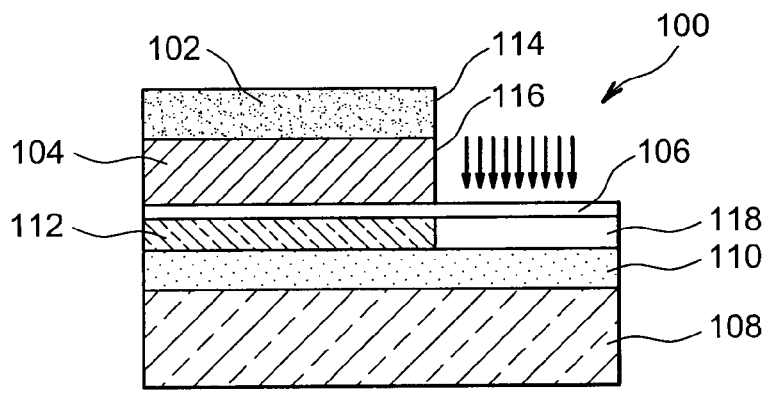

In FIG. 4, a first ion implantation is next performed in a part of the second silicon layer 112 not covered by the gate layer 104, forming an N+ drain region 118.

In a variant, the first ion implantation can consist of a first step of producing a lightly doped region LDD or LDS, not shown, by ion implantation in the part of the second silicon layer 112 not covered by the gate layer 104. This region is implanted so that it is situated alongside the edge 116 of the future gate, intended to be up against the channel region of the transistor. The first implantation is completed by a second step of doping the rest of the part of the second layer of silicon 112 not covered by the gate layer 104, forming the N+ drain region 118.

It is also possible to produce, before implementing the second doping step, a spacer up against the edge 116 of the gate layer 104. Thus, during the second doping step, the region LDD or LDS implanted close to the future channel region is protected from this doping by the spacer. After the second doping step, this spacer can be eliminated or kept on the device 100.

The regions LDD or LDS are doped more lightly than the source and drain regions. The doses of dopants implanted in these two types of region can for example be between approximately $1.10^{14}$ and $5.10^{15}$ atoms/$cm^2$. The energy of the beams used can for example be between approximately 1 KeV and 100 KeV.

Figure 5:
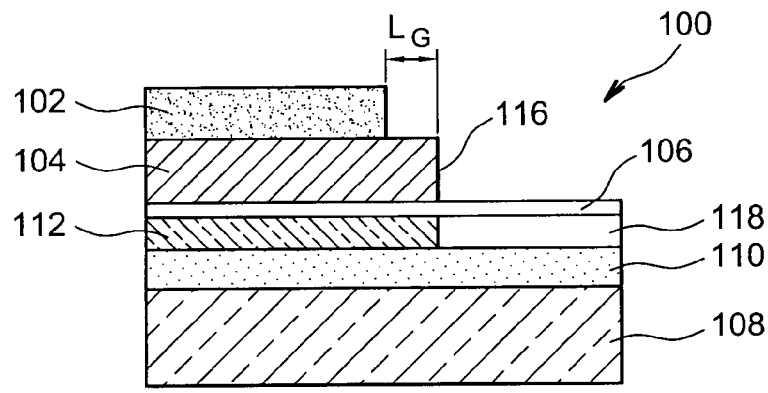

A trimming, or paring, of the first hard mask 102 is then carried out, from the edge 114, by isotropic chemical attacks, for example of the 1% HF type for a hard mask 102 based on $SiO_2$, over a length equal to the gate length $L_G$ required (FIG. 5). The part of the layer 104 thus uncovered is intended to form the future gate of the transistor 100.

Figure 6:
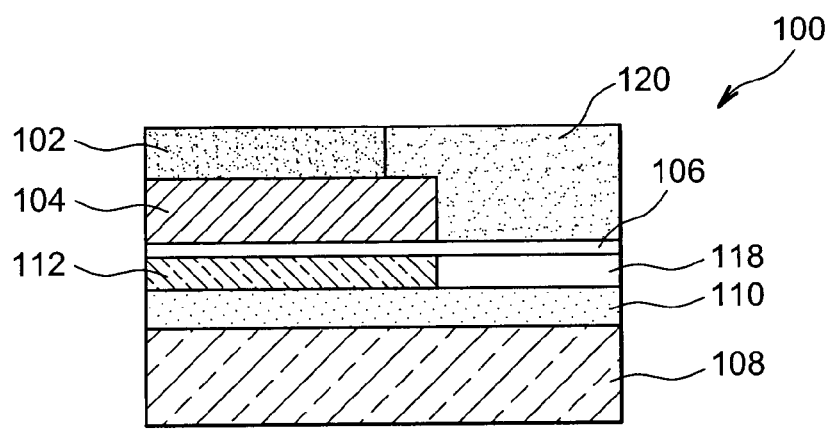

In FIG. 6, a layer of second mask is deposited, for example based on $SiO_2$ and by LPCVD, on the uncovered parts of the dielectric layer 106 and of the gate layer 104. A surfacing by CMP ("Chemical and Mechanical Polishing") eliminates the material of this layer of second mask deposited on the first hard mask 102, stopping on the first hard mask 102, and thus forming a second hard mask 120.

Figure 7:
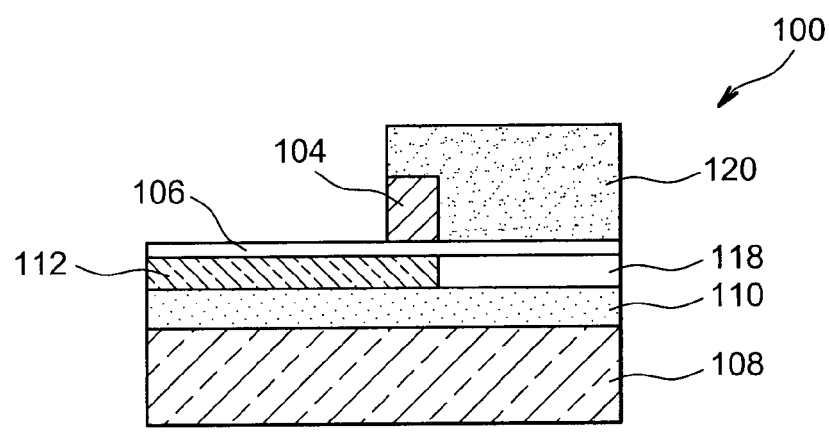

The first hard mask 102 is next removed selectively with respect to the second hard mask 120, for example by chemical attack of the $H_3PO_4$ type if the first hard mask 102 is based on silicon nitride and the second hard mask 120 based on $SiO_2$. The part of the gate layer 104 not covered by the second hard mask 120 is then etched, the remaining part of the gate layer 104 forming the gate of the transistor 100 (FIG. 7). In the remainder of the description, the reference 104 is used to designate the gate.

Figure 8:
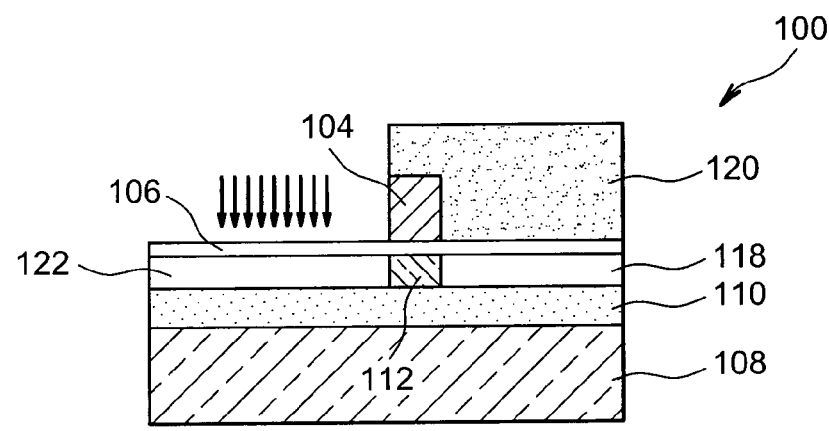

As shown in FIG. 8, a second ion implantation is then carried out in the second layer of silicon 112, forming a source 122, here P+ in order to asymmetrise the dopings of the source and drain of the TFET transistor 100. The remaining part of the second layer of silicon 112 forms the channel of the transistor 100.

In a variant, as for the first ion implantation, the second ion implantation can consist of a first step of producing a lightly doped region LDD or LDS, not shown, by ion implantation in the part of the second layer of silicon 112 not covered by the gate layer 104 and the second etching mask 120. This region LDD or LDS is implanted so that it is situated alongside the edge of the gate 104, intended to be up against the channel region of the transistor. The second implantation is completed by a second step of doping the rest of the part of the second layer of silicon 112 not covered by the gate 104 and the second etching mask 120.

It is also possible to produce, before implementing the second doping step, a spacer up against the edge of the gate 104. Thus, during the second doping step, the region LDD or LDS implanted close to the future channel region is protected from this doping by the spacer. After the second doping step, this spacer can be eliminated or kept on the device 100.

In the case of the production of a transistor of the MOS type, the second ion implantation could form a source symmetrical with the drain, for example of the P+ type in the case of the production of a P-MOS. In addition, it is also possible, in the case of the production of a transistor of the MOS type, to carry out the doping of the source and drain regions by a single ion implantation step, for example implemented after having produced the gate and removed the etching masks situated on these regions.

In general terms, in the case of a MOSFET, the implantations carried out on each side of the gate are of the same type, but may, if the optimisation of the transistor so requires, have different characteristics (dose, energy, angle, dopant).

This method can also apply to the production of an asymmetric MOS transistor, at least one spacer formed during at least one of the ion implantations making it possible to produce one of the source or drain regions different from the other.

Figure 9:
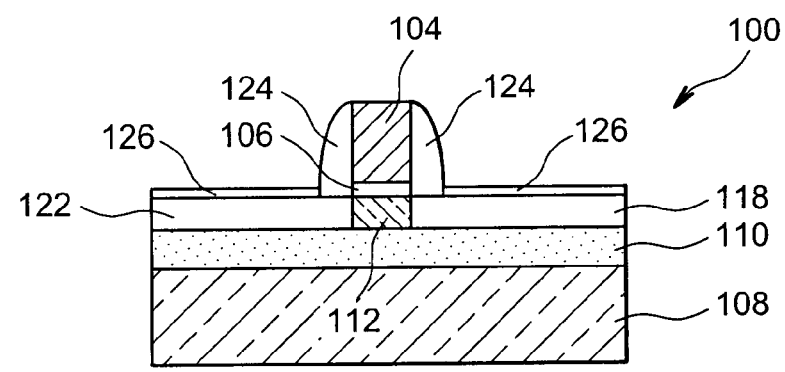

Finally, in FIG. 9, the second hard mask 120 is removed, for example by etching, the parts of the dielectric layer 106 not covered by the gate 104 are etched, spacers 124 around the gate 104 are produced, and a layer of silicide 126 is produced on the source 122 and drain 118 of the transistor 100 by a succession of a deposition of a layer of metal, for example nickel and/or cobalt and/or platinum, annealing to form the silicide, removal of the metal that has not formed silicide, for example with a solution based on $H_2SO_4$ and $H_2O_2$, and then an annealing, the parameters of which are determined so as to bring the silicide to a resistivity as low as possible without degradation of the layer.

If spacers have previously been produced and kept on the device 100 (during ion implantations), these spacers can then form the spacers 124 around the gate 104.

A method of producing a transistor of the N-IMOS type 200 will now be described in relation to FIGS. 10 to 13.

Figure 10:
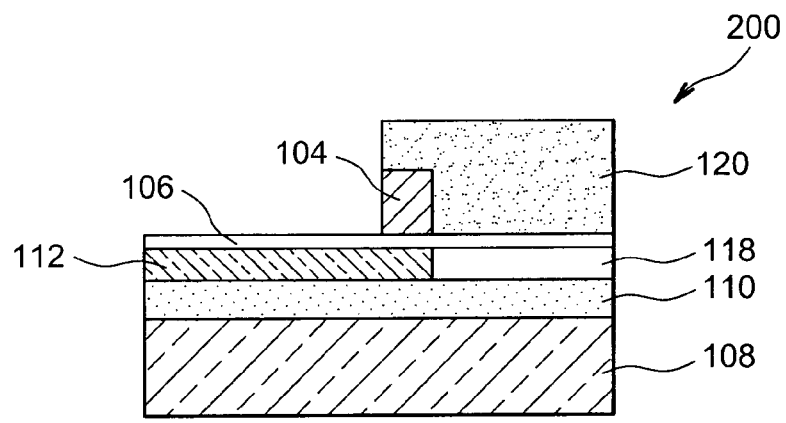
FIGS. 10 to 13 show steps of a method of producing a transistor of the IMOS type according to a particular embodiment, FIGS. 14 and 15 each show a top view of a device produced according to a production method according to a particular embodiment.

As shown in FIG. 10, first of all steps similar to those described previously in relation to FIGS. 1 to 7 are performed, for example using a structure similar to that shown in FIG. 1.

Figure 11:
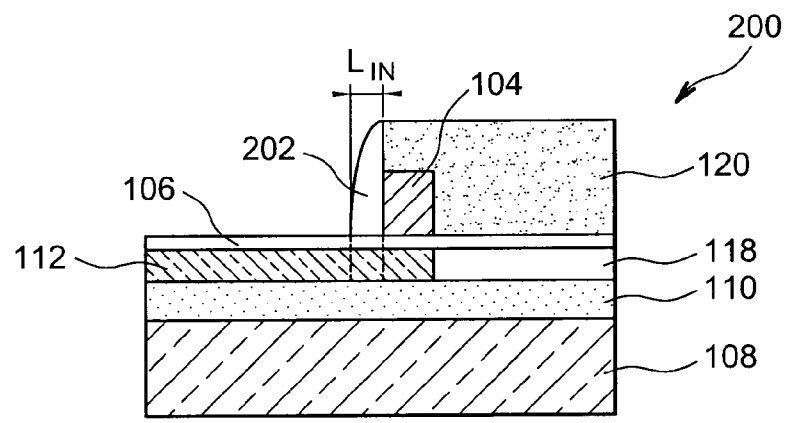

Next a spacer 202 is produced, for example based on $SiO_2$, and/or SiN, up against the uncovered edge of the gate 104, of length $L_{IN}$ (FIG. 11).

Figure 12:
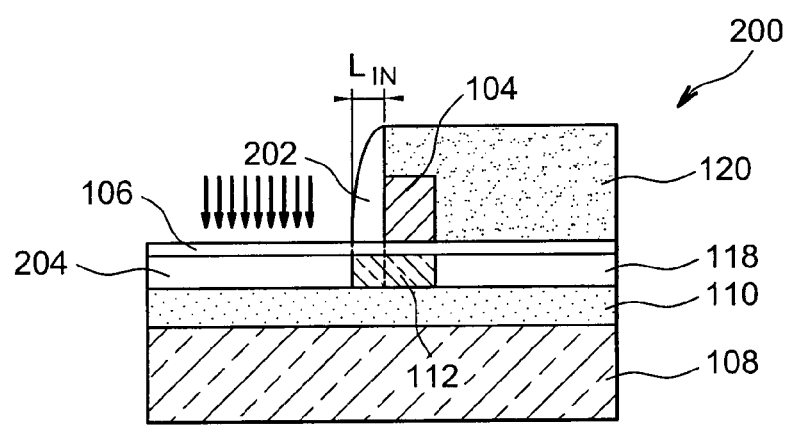

In FIG. 12, a second ion implantation is next carried out in the second layer of silicon 112, forming a source 204, here P+, in order to asymmetrise the doping of the source and drain of the IMOS transistor 200. The remaining part of the second layer of silicon 112 forms the channel of the transistor 200. In addition, the spacer 202 produced previously also fulfils the role of a mask for this implantation, the ions not being implanted in the part of the layer 112 situated under the spacer 202.

Figure 13:
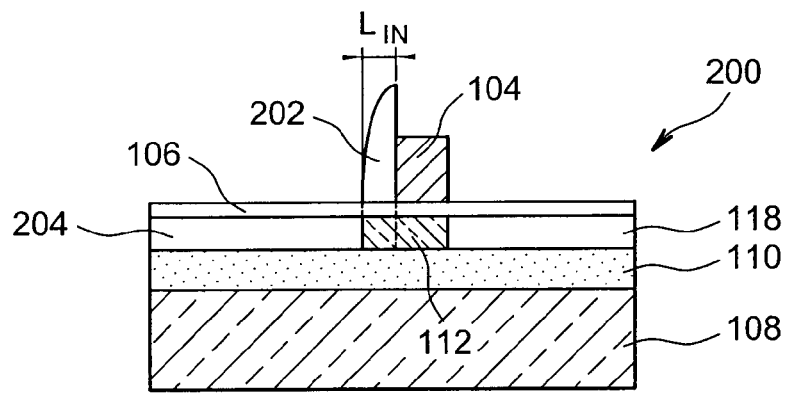

As shown in FIG. 13, the second hard mask 120 is removed, for example by etching. In the case where the spacer 202 is based on SiN, this can remain present on the device 200, unlike the case where the spacer 202 is based on $SiO_2$, which can be removed from the device 200 at the same time as the second hard mask 120.

The device 200 is then completed in a similar manner to the device 100 by producing one or more spacers around the gate 104, or producing a layer of silicide on the source 204 and the drain 118 of the transistor 200. When the spacer 202 is removed from the device 200 at the same time as the second hard mask 120, a protective layer for the intrinsic region of the layer 112 situated at the region previously occupied by the spacer 202 is produced before the layer of silicide is produced. This protective layer can be produced from an insulating material not reacting with the metal used for the siliciding, for example silicon nitride and/or silicon oxide.

In this way an N-IMOS transistor 200 is obtained comprising an asymmetry with regard to the doping of the source (P+) 204 and the drain (N+) 118, and a structural asymmetry with regard to the channel region 112 that is not entirely covered by the gate 104.

This method can also be implemented for producing an asymmetric MOS transistor. In this case, the two ion implantations form regions of the same conductivity type.

In the two methods described previously, the transistors 100 and 200 are produced on an SOI substrate formed by the first layer 108 based on semiconductor, the layer of oxide 110 and the second layer 112 based on semiconductor. In a variant, these transistors 100 and 200 could be produced on a solid substrate based on at least one semiconductor such as silicon and/or germanium and/or any other semiconductor. In another variant, the transistors 100 and 200 could be produced on a GeOI (germanium on insulator) substrate, the second layer 112 then being based on germanium, SiGeOI (SiGe on insulator), or SSOI (stressed silicon on insulator).

Likewise, in another variant of the two methods described previously, the first mask layer 102 can be based on any material(s) able to serve as a hard mask during an implantation step, able to be attacked chemically for carrying out the trimming of this layer 102, able to serve as a stop layer during the smoothing step CMP, and able to be attacked selectively vis-à-vis the second hard mask 120. Preferably, this layer of first mask 102 is based on nitride. The second hard mask 120 can also be based on at least one material able to serve as a hard mask during an implantation step and able to be attacked selectively vis-à-vis the layer of first mask 102. Preferably, the second hard mask 120 is based on $SiO_2$.

Figure 14:
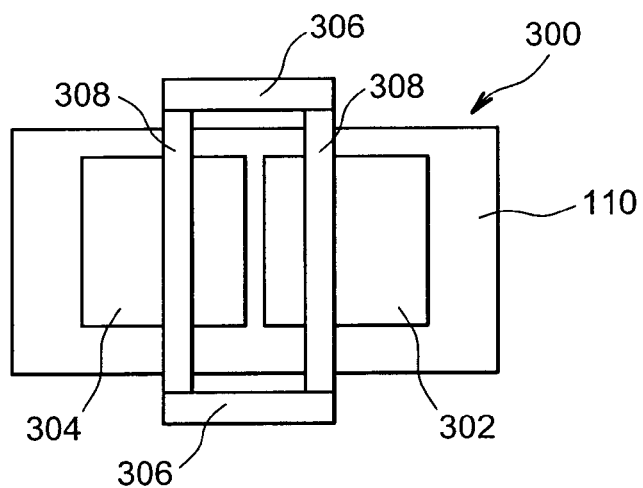

FIG. 14 shows a plan view of two active regions 302 and 304 of two transistors of a device 300 produced in accordance with one of the methods described previously. Active region of a transistor means the source, drain and channel regions of this transistor. This device 300 is produced from an SOI substrate, the buried oxide layer 110 situated under the active areas 302 and 304 being shown in this figure. In FIG. 14, it can be seen that the implementation of the methods of producing transistors leaves a bead of gate 306 around the active regions 302 and 304. This can be used to connect the two gates 308 of the two transistors. This gate bead 306 can advantageously be used during the production of an inverter from the two transistors of the device 300, for example two transistors of the TFET type similar to the transistor 100, the gates of which are connected. It is also possible to define only one active region in the case of the production of an inverter. Finally, if it is wished to eliminate this gate bead 306 after the transistors are produced, a step of masking the gates of the transistors and an additional etching step are performed.

Figure 15:
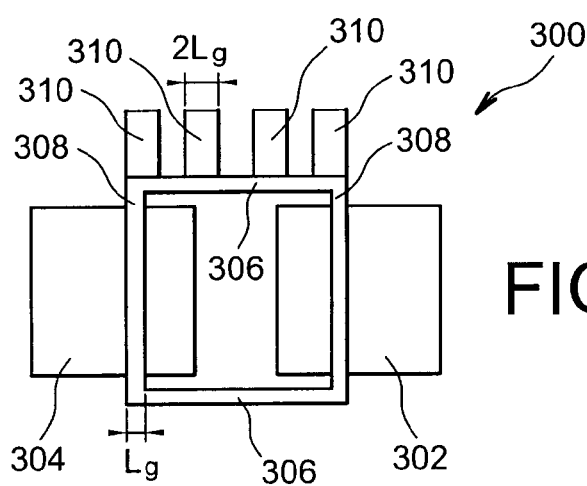

The gates of the transistors produced by one of the methods described previously are then connected to a gate contact. If the gate length $L_G$ is less that the size of the gate contact, it is possible to define regions connected to the gates, situated outside the active regions of the transistors, with dimensions greater than those of the gates and making it possible to connect thereto one or more gate contacts. For example, in FIG. 15, showing the device 300, it can be seen that the gates 308 are connected by the gate bead 306 and that the regions 310 produced from the gate layer with which the gates 308 form fingers with a size of between approximately $L_G$ and $2L_G$. A gate contact can then be produced, connected to several regions 310.

With the methods described previously, it is possible to produce circuits comprising transistors of the MOS type and/or of the IMOS type and/or of the TFET type, thus making it possible to exploit, on one and the same device, the specificities of each one and to optimise the performance of the circuit.

The invention claimed is:

1. Method of producing a transistor, comprising at least the steps of:
   a) producing a stack comprising at least one substrate based on at least one semiconductor, on which there are disposed a dielectric layer, a gate layer and a layer of first mask,
   b) producing a first etching mask from the layer of first mask, one edge of the first etching mask forming a pattern of a first edge of a gate of the transistor to be produced,
   c) etching at least a first part of the gate layer not covered by the first etching mask, forming the first edge of the gate,
   d) first ion implantation in a first part of the substrate not covered by the gate layer,
   e) trimming said edge of the first etching mask over a length substantially equal to a gate length of the transistor, revealing a second part of the gate layer,
   f) producing a second etching mask at least on the second part of the gate layer and on a part of the dielectric layer not covered by the gate layer,
   g) removing the first etching mask,
   h) etching a third part of the gate layer not covered by the second etching mask, forming a second edge of the gate, the remaining part of the gate layer forming the gate,
   i) second ion implantation in a second part of the substrate not covered by the gate and/or by the second etching mask,
   j) removal of the second etching mask.

2. Method according to claim 1, the dielectric layer being based on $SiO_2$ and/or on any other dielectric material with high permittivity, such as $HfO_2$ and/or $ZrO_2$ and/or $Al_2O_3$.

3. Method according to claim 1, the production of the second etching mask being obtained by a step of deposition of a layer of second mask at least on the second part of the gate layer, on the part of the dielectric layer not covered by the gate layer and on the first etching mask, and a step of mechanical/chemical polishing of the layer of second mask, baring the first etching mask and forming the second etching mask.

4. Method according to claim 1, the first and second ion implantations forming source and drain regions doped with the same type of conductivity.

5. Method according to claim 1, one of the first or second ion implantations forming a doped region of the N+ type and the other one of the first or the second ion implantations forming a doped region of the P+ type.

6. Method according to claim 1, the first and/or second ion implantation being implemented by a first step of producing at least one lightly doped region by ion implantation, respectively in said first and/or second part of the substrate, intended to be up against the channel region of the transistor, and a second step of doping said first and/or second part of the substrate.

7. Method according to claim 6, also comprising, between the first step of producing a lightly doped region and the second doping step, a step of producing at least one spacer at the edge of the gate, the second doping step being performed in the part of the substrate not masked and/or not covered by the spacer.

8. Method according to claim 1, also comprising, between step h) and step i), a step of producing at least one spacer on the dielectric layer, up against the second edge of the gate, the second ion implantation of step i) being performed in the second part of the substrate also not covered by said spacer.

9. Method according to claim 1, step e) of trimming the edge of the first etching mask being performed by an isotropic chemical attack.

10. Method according to claim 1, also comprising, after step j) of removing the second etching mask, a step of removing parts of the dielectric layer not covered by the gate.

11. Method according to claim 10, also comprising, after the step of removing the parts of the dielectric layer not covered by the gate, a step of producing gate spacers around the gate.

12. Method according to claim 10, also comprising, after the step of removing the parts of the dielectric layer not covered by the gate, a step of producing a layer of silicide on the doped parts of the substrate.

13. Method according to claim 1, the gate layer being based on at least one metal and/or polysilicon material, and/or TiN and/or any other compatible material for forming a transistor gate material.

14. Method according to claim 1, the first and/or the second (120) etching mask being based on $SiO_2$ and/or SiN and/or amorphous carbon.

* * * * *